US006958619B2

(12) United States Patent

Yamaoka et al.

(10) Patent No.: US 6,958,619 B2
(45) Date of Patent: *Oct. 25, 2005

(54) INSPECTING APPARATUS AND INSPECTING METHOD FOR CIRCUIT BOARD

(75) Inventors: Shuji Yamaoka, Fukuyama (JP); Shogo Ishioka, Fukayasu-gun (JP)

(73) Assignee: OHT, Inc., Hiroshima (JP)

( * ) Notice: Subject to any disclaimer, the term of this patent is extended or adjusted under 35 U.S.C. 154(b) by 137 days.

This patent is subject to a terminal disclaimer.

(21) Appl. No.: 10/169,749

(22) PCT Filed: Nov. 15, 2001

(86) PCT No.: PCT/JP01/09992

§ 371 (c)(1),
(2), (4) Date: Jul. 17, 2002

(87) PCT Pub. No.: WO02/41018

PCT Pub. Date: May 23, 2002

(65) Prior Publication Data

US 2003/0001561 A1 Jan. 2, 2003

(30) Foreign Application Priority Data

Nov. 17, 2000 (JP) ...................................... 2000-351452

(51) Int. Cl.[7] ................................................ G01R 31/02
(52) U.S. Cl. ....................................................... 324/761
(58) Field of Search ......................... 324/761, 537–538, 324/754, 158.1

(56) References Cited

U.S. PATENT DOCUMENTS 5,017,864 A * 5/1991 Kaida et al. ................ 324/754
5,254,953 A * 10/1993 Crook et al. ................ 324/537
5,686,994 A * 11/1997 Tokura ........................ 356/394
5,757,193 A * 5/1998 Yu et al. ...................... 324/501
5,969,530 A * 10/1999 Yamashita .................. 324/537
6,097,202 A * 8/2000 Takahashi ................... 324/537
6,160,409 A * 12/2000 Nurioka ...................... 324/754
6,201,398 B1 * 3/2001 Takada ........................ 324/537
6,456,102 B1 * 9/2002 Mori et al. ................. 324/765
6,710,607 B2 * 3/2004 Fujii et al. .................. 324/538
2002/0135390 A1 * 9/2002 Fujii et al. .................. 324/761
2002/0180455 A1 * 12/2002 Okano et al. .............. 324/530

FOREIGN PATENT DOCUMENTS

JP 9-264919 10/1997

OTHER PUBLICATIONS

Patent Abstract of Japan, Publication No. 2000–131393, dated May 12, 2000. See PCT search report.

* cited by examiner

*Primary Examiner*—David Zarneke
*Assistant Examiner*—Jermele Hollington
(74) *Attorney, Agent, or Firm*—Westerman, Hattori, Daniels & Adrian, LLP

(57) ABSTRACT

The present invention provides an apparatus and method for inspecting a circuit board at a high speed. A PDP driver module 100 as an object to be inspected has an onboard PDP driving LSI 110. A plurality of circuit wirings 111 are connected to terminals of the LSI. An inspection apparatus 1 generates an LSI drive signal and sends it to input terminals 113 of the LSI 110. A sensor 2 is positioned opposedly to the circuit wirings 111 in a non-contact manner. The sensor 2 detects voltage values in circuit wirings 111 caused by driving the LSI 110, and the detected signals are analyzed by the inspection apparatus 1.

33 Claims, 5 Drawing Sheets

INSPECTING APPARATUS AND INSPECTING METHOD FOR CIRCUIT BOARD

TECHNICAL FIELD

The present invention relates to an apparatus and a method for inspecting a circuit board.

BACKGROUND ART

In manufacturing processes of a circuit board, after forming circuit wirings on a board, it is required to inspect the presence of a disconnection or open circuit in the circuit wirings.

Heretofore, an open circuit state in circuit wirings on a circuit board has been determined by bringing a pair of pins into contact with two different portions of each circuit wiring and then checking conduction between the positions.

However, in an area of the circuit board, such as the vicinity of an integrated circuit, where the circuit wirings are formed in close proximity to each other, it is difficult to assure a sufficient interval between the pins. On the other hand, a non-contact type inspection method (Japanese Patent Laid-Open Publication No. 09-264919) has been proposed. However, since this inspection method has still been required to bring one pin into contact with each input section of the circuit wirings, it has been suffered from complicated and time-consuming positioning operations when circuit wirings such as those around an integrated circuit are in close proximity to each other and each of the circuit wirings has a short length.

In view of the problems in the above conventional methods, it is therefore an object of the present invention to provide an apparatus and a method capable of inspecting a circuit board at a high speed.

DISCLOSURE OF THE INVENTION

In order to achieve the above object, according to a first aspect of the present invention, there is provided an apparatus for inspecting a circuit board incorporating an integrated circuit, comprising: drive means for forcibly driving the integrated circuit to generate output signals sequentially from a plurality of output terminals of the integrated circuit; detect means for detecting in a non-contact manner a voltage value in a plurality of circuit wirings connected to the output terminals; comparison means for comparing the voltage value to a normal value; and defect determination means for determining a defect in the circuit wirings according to the comparison result in the comparison means.

In the apparatus according to the first aspect of the present invention, the detect means may include voltage change detect means for detecting in a non-contact manner a voltage change in a plurality of circuit wiring connected to the output terminals, and integration means for integrating the voltage change to derive a voltage value. The integration means may be a capacitance for integration. The detect means may further include amplification means for amplifying the voltage change, and the integration means may be a part of the amplification means.

The comparison means may be operable to compare a waveform provided by plotting the voltage value on a time axis to a normal waveform.

The detect means may be adapted to generate a waveform representing the voltage change. In this case, when the waveform includes an abnormal waveform, the defect determination means may be operable to identify defective one or ones of the circuit wirings according to the location of the abnormal waveform on a time axis.

The above voltage change detect means may include a single sensor board opposed to the plurality of circuit wirings in a non-contact manner to detect the voltage change in any one part of the plurality of circuit wiring. In this case, the sensor board may include a single conductive plate having a dimension arranged to cover the plurality of circuit wirings, the conductive plate including a single output terminal.

The plurality of circuit wirings of voltage change detect means may be driven to sequentially generate pulse signals as the output signals. In this case, the voltage change detect means may be operable to sequentially differentiate the pulse signals and add the adjacent differential values to provide the sum as the voltage change.

The determination means may be operable, responsive to the comparison result in the comparison means indicating that the voltage value is equal to or less than a given value, to determine that the circuit wiring corresponding to the voltage value includes an open circuit.

The drive means may include a power supply for supplying a power to the integration circuit, and current detect means for detecting a current from the power supply. In this case, the defect determination means may be operable to identify the circuit wirings having a short circuit according to the timing when a current waveform detected by the current detect means is significantly disordered.

The defect determination means may be operable to inspect a characteristic of the integrated circuit according to the comparison result in the comparison means.

According to a second aspect of the present invention, there is provided an apparatus for inspecting a circuit board for use in a PDP driver, comprising: detect means for detecting in a non-contact manner a voltage waveform in all of circuit wirings connected in a one-on-one arrangement to terminals of an LSI for use in a PDP driver; determination means for determining whether or not the detected voltage waveform has a normal shape; and identification means responsive to the determination of an abnormality in the voltage waveform to identify defective one or ones of the circuit wirings according to the timing of occurrence of the abnormal waveform.

In the apparatus according to the second aspect of the present invention, this apparatus may further include drive means for forcibly driving the LSI to generate output signals sequentially from the terminals of the LSI. The drive means may include a power supply for supplying a power to the LSI, and current detect means for detecting a current from the power supply, and the defect determination means may be operable to identify the circuit wirings having a short circuit according to the timing when a current waveform detected by the current detect means is significantly disordered.

The determination means may be operable responsive to the abnormality of a missing voltage waveform to determine that the circuit wiring corresponding to the missing voltage waveform includes an open circuit.

The apparatus according to the second aspect of the present invention may further include LSI inspection means for detecting abnormality in the LSI according to the determination result in the determination means.

In order to achieve the aforementioned object, according to a third aspect of the present invention, there is provided a method for inspecting a circuit board incorporating an integrated circuit, comprising the steps of: forcibly driving the integrated circuit to generate output signals sequentially from a plurality of output terminals of the integrated circuit; detecting in a non-contact manner a voltage value in a plurality of circuit wirings connected to the output terminal; comparing the detected voltage value to a given value; and determining a defect in the circuit wirings according to the comparison result in the comparing step.

In the method according to the third aspect of the present invention, the detecting step may include the steps of: detecting in a non-contact manner a voltage change in a plurality of circuit wirings connected the output terminals, and integrating the voltage change to derive a voltage value. In this case, the integrating step may include the step of deriving the voltage value from the voltage change by means of a capacitance for integration. The detecting step may further include the step of amplifying the voltage change, and the integrating step is a part of the amplifying step. The comparing step may include the step of comparing a waveform provided by plotting the voltage value on a time axis to a normal waveform. When the detecting step includes the step of generating a waveform representing the voltage change, the defect determining step may include the step of when the waveform includes an abnormal waveform, identifying defective one or ones of the circuit wirings according to the location of the abnormal waveform on a time axis. The above voltage change detecting step may also include a step of detecting the voltage change in any one part of the plurality of circuit wiring by use of a single sensor board opposed to the plurality of circuit wirings in a non-contact manner.

Further, the driving step may include the step of driving the plurality of circuit wirings to sequentially generate pulse signals as the output signals. In this case, the voltage change detecting step may include the step of sequentially differentiating the pulse signals and adding the adjacent differential values to provide the sum as the voltage change. The determining step may include the step of responsive to the comparison result in the comparison means indicating that the voltage value is equal to or less than the given value, determining that the circuit wiring corresponding to the voltage value includes an open circuit. The driving step may include the step of detecting a current from a power supply for supplying a power to the integration circuit, and the defect determining step may include the step of identifying the circuit wirings having a short circuit according to the timing when a current waveform detected by the current detect means is significantly disordered. The defect determining step may include the step of inspecting a characteristic of the integrated circuit according to the comparison result in the comparing step.

According to a fourth aspect of the present invention, there is provided a method for inspecting a circuit board for use in a PDP driver, comprising the steps of: detecting in a non-contact manner a voltage waveform in all of circuit wirings connected in a one-on-one arrangement to terminals of an LSI for use in a PDP driver; determining whether or not the detected voltage waveform has a normal shape; and responsive to the determination of an abnormality in the voltage waveform, identifying defective one or ones of the circuit wirings according to the timing of occurrence of the abnormal waveform.

In the method according to the fourth aspect of the present invention, this method may further include the step of forcibly driving the LSI to generate output signals sequentially from the terminals of the LSI.

The driving step may include the step of detecting a current from a power supply for supplying a power to the LSI. in this case, the defect determining step may include the step of identifying the circuit wirings having a short circuit according to the timing when a current waveform detected by the current detect means is significantly disordered.

The determining step may include the step of responsive to the abnormality of a missing voltage waveform to determine that the circuit wiring corresponding to the missing voltage waveform includes an open circuit.

Further, the method according to the fourth aspect of the present invention may include the step of detecting abnormality in the LSI according to the determination result in the determining step.

DESCRIPTION OF THE PREFERRED EMBODIMENT

With reference to the drawings, the present invention will now be described in detail in conjunction with a preferred embodiment intended simply to show as an example. Therefore, the present invention is not limited to any arrangement, numerical values and others of elements or components described in this embodiment unless otherwise specified.

Embodiment

As one embodiment of the present invention, a system for inspecting a circuit board incorporating an integrated circuit will be described below.

<Construction of Inspection System>

Figure 1:
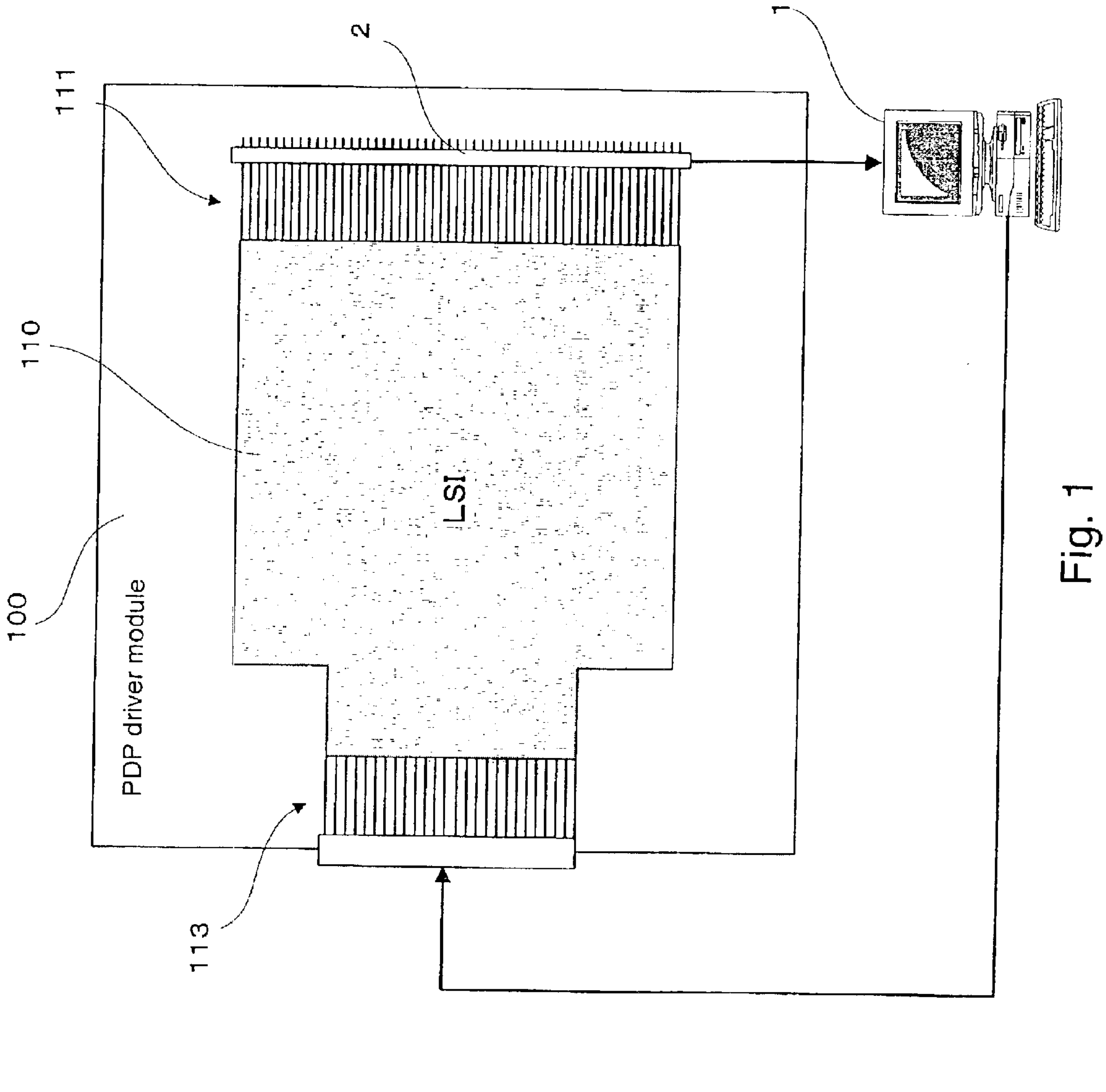
FIG. 1 is a schematic diagram showing the entire construction of an inspection system according to one embodiment of the present invention.

FIG. 1 is schematic diagram showing the inspection system in an inspection operation of a circuit board 100.

A plasma display panel (PDP) driver module 100 as an object to be inspection has an onboard PDP driving LSI 110. A plurality of first circuit wirings 111 (hereinafter referred to as "LSI circuit-wiring group") printed on the circuit board are connected to terminals of the LSI 110, respectively. Further, a plurality of second circuit wirings 113 are connected to input terminals of the LSI 110, respectively.

The inspection system comprises an inspection apparatus 1 composed of a computer, and a sensor 2. The inspection apparatus 1 is a general-purpose computer incorporating a PDP driving program, a circuit and program for analyzing detected signals from the sensor, an interface for allowing communication between the sensor and the PDP driver module, and others.

The inspection apparatus 1 generates an LSI drive signal and sends it to the input terminals 113 of the LSI 110. Voltage changes in the LSI circuit-wiring group 111 caused by the LSI drive signal are detected by the sensor 2, and then voltage values (voltage waveform) obtained by integrating the detected voltage changes are analyzed in the inspection apparatus 1.

The sensor 2 is positioned opposedly to the LSI circuit-wiring group 111 in a non-contact manner. The sensor 2 detects the voltage changes in the LSI circuit-wiring group 111 caused by driving the LSI 110, and integrates the detected voltage changes by an integration capacitance (see FIG. 2) to convert them into certain voltage values, followed by sending them to the inspection apparatus 1 as eventual detected signals or sensor output signal. While the distance between the sensor and the LSI circuit-wiring group is desired to be 0.05 mm or less, the voltage changes can be detected as long as the distance is set in 0.5 mm or less. The sensor may be closely placed on the circuit board with interposing a dielectric insulating material therebetween.

Figure 2:
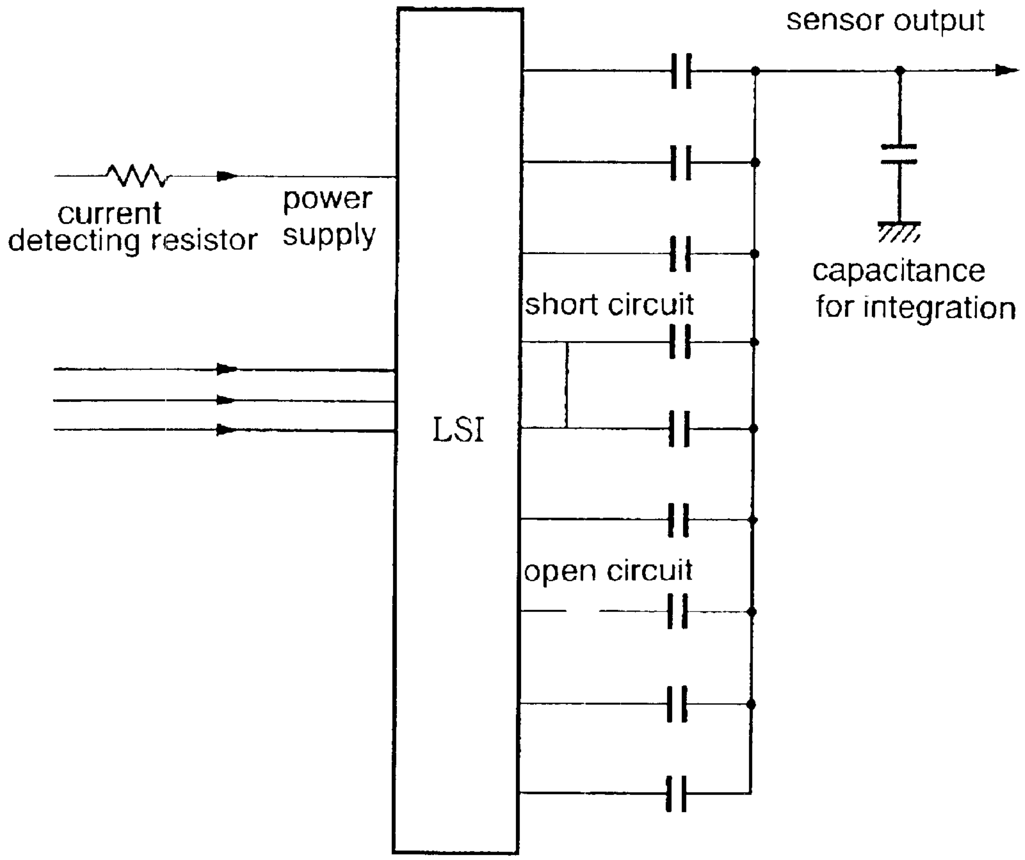
FIG. 2 illustrates an equivalent circuit of a sensor, LSI and circuit wirings in the inspection system of FIG. 1.

FIG. 2 shows an equivalent circuit showing the relationship of the sensor, the LSI and the LSI circuit-wiring group. As illustrated, it can be assumed that the sensor is connected with the LSI through a plurality of capacitive couplings. Thus, pulse waves from the LSI are converts into differential waves, and then these differential waves are received by the sensor as detected signals.

Figure 3:
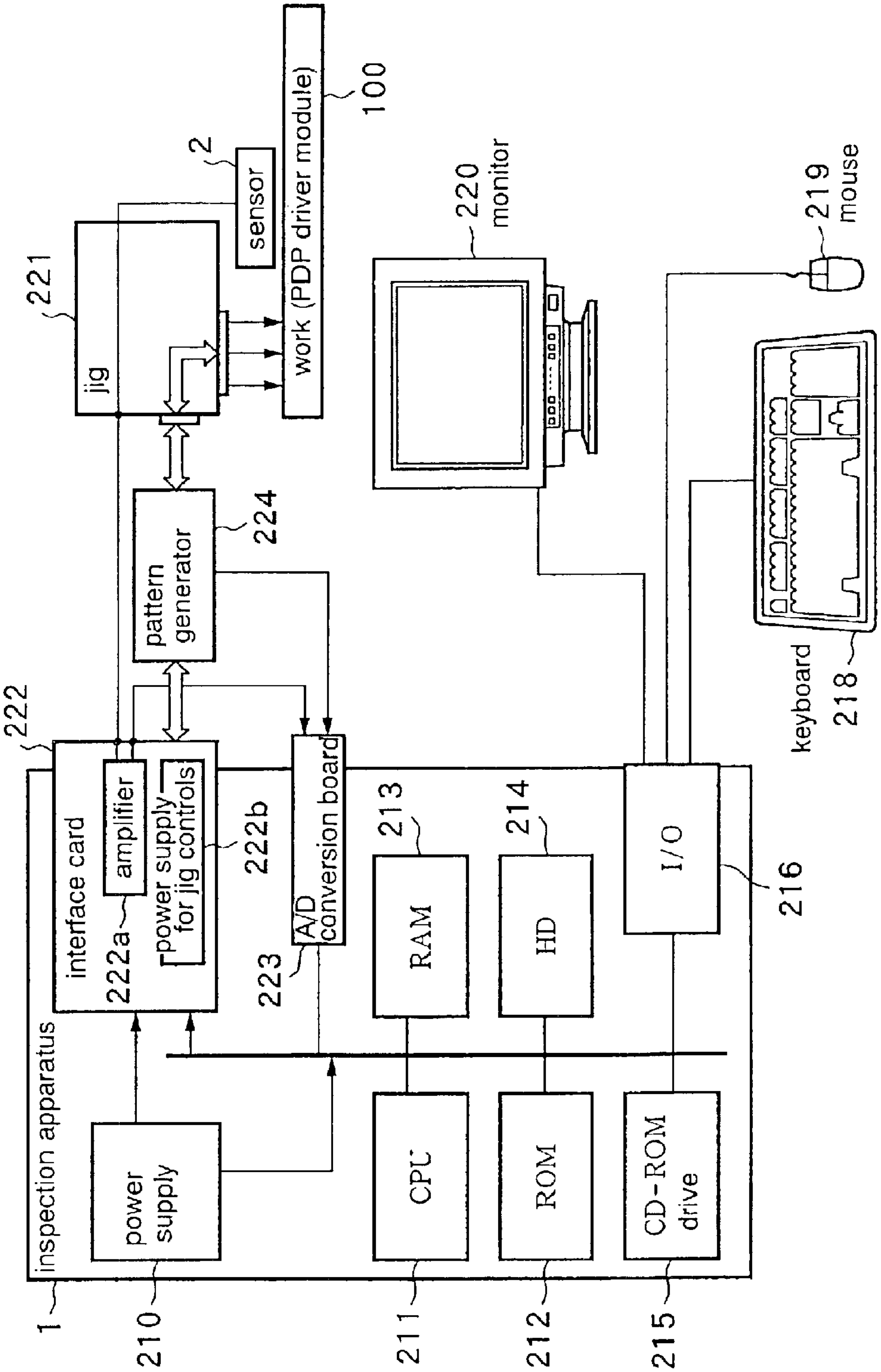
FIG. 3 is a block diagram mainly showing the internal construction of an inspection apparatus of the inspection system according the embodiment of the present invention.

With reference to FIG. 3, the internal construction of the inspection apparatus 1 will be described below. FIG. 3 is a block diagram showing the hardware of the inspection apparatus 1.

The reference numeral 210 indicates a power supply for supplying a power to the entire inspection apparatus 1, the reference numeral 211 indicating a CPU for performing various operations and controlling the entire inspection apparatus 1, the reference numeral 212 indicating a ROM for storing programs executed in the CPU 211, fixed values or the like, the reference numeral 213 indicating a RAM as a temporary memory. The RAM includes a program loading area for storing loaded programs, a memory area for digital signals received from the sensor, and others.

The reference numeral 214 indicates a hard disk (HD) as an external memory. The reference numeral 215 indicates a CD-ROM drive as a read device for a detachable storage medium.

The reference numeral 216 indicates an input/output interface. The inspection apparatus sends and receives signals to/from a keyboard 218 as an input device, a mouse 219 and a monitor 220 through the input/output interface 216.

A jig 221 sends signals to the PDP driver module as a work. The computer as the inspection apparatus 1 is expanded to have compatibility for inspecting the LCD driver module, and an interface card 222 and an A/D conversion board 223 are incorporated therein. The interface card 222 contains an amplifier 222*a*. Thus, the detected signals from the sensor are amplified by the amplifier, and then sent to the A/D conversion board 223. The interface card 222 further includes a power supply 222*b* for jig controls. The inspection apparatus 1 is further provided with a current detecting resistor (not shown) for monitoring consumption-current ripples in the power supply 222*b*. One of the circuit wirings having a short circuit can be identified by detecting the timing when a significant disorder caused in the current waveform.

A pattern generator 224 is interposed between the interface card 222 and the jig 221 to generate an input signal having a specific pattern in conformity with the IC for the PDP driver as a work. The generated pattern is also sent from the pattern generator to the A/D conversion board, and used to analyze the detected signals.

Various programs such as a PDP-driver control program, jig control program and detected-signal analysis program are stored in the HD 214, and each program is loaded on the program loading area of the RAM 213 and executed. An image data (CAD data) representing each shape of circuit wirings in design is also stored in the HD 214.

The PDP and/or jig control programs (including a pattern-generating program) may be installed by reading a CD-ROM with the CD-ROM drive. Otherwise, these programs may be read from other medium such as a FD or DVD, or may be downloaded via networks.

The sensor 2 is made of a conductive material including metals such as aluminum or copper, and semiconductors. Preferably, the sensor 2 has a dimension capable of covering all of the circuit wirings or the circuit-wiring groups.

While FIG. 3 shows one mode in which the single inspection apparatus 1 is connected to the single jig to inspect the single work, a plurality of interface cards may be incorporated in a single inspection apparatus to simultaneously inspect a plurality of works.

Figure 4:
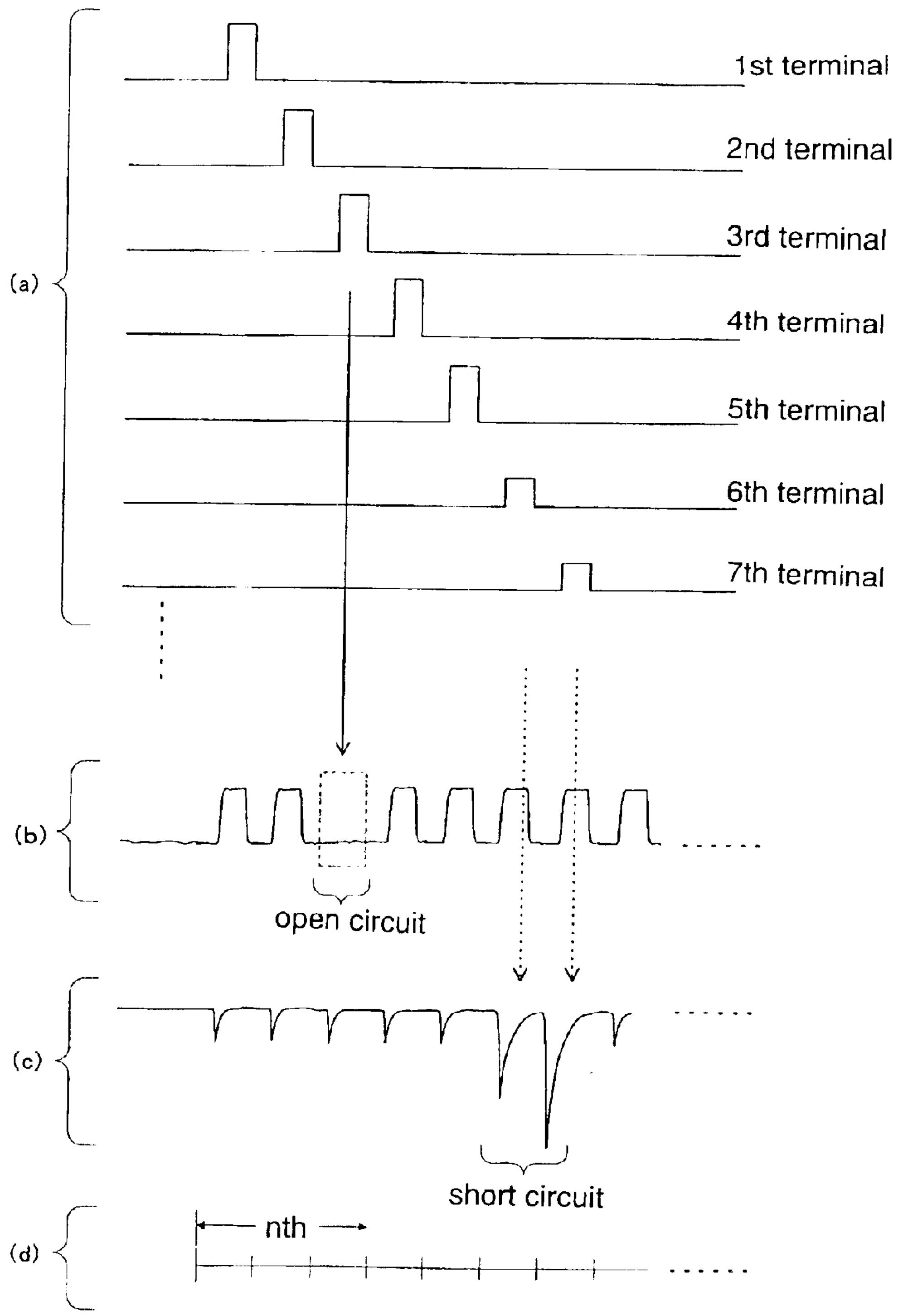
FIG. 4 is an explanatory diagram of a method for inspecting a circuit board by use of the inspection apparatus according to the embodiment of the present invention.

With reference to FIG. 4, a method for detecting defects in the LSI circuit-wiring group will be described below.

The LSI is forcedly driven so that its 1st to N-th terminals provide output pulse signals as shown in FIG. 4(*a*). Since the eventual waveform of the signal detected by the sensor 2 has substantially a pulse-like shape as shown in FIG. 4(*b*) because the differential value of the initial pulse signal is integrated. The current waveform in the current detecting resistor connected to the power supply has a shape as shown in FIG. 4(*c*). If one circuit wiring has an open circuit, a pulse appearing in the corresponding terminal cannot reach the end of the circuit wiring, and the pulse is not detected by the sensor 2. Thus, the waveform of the detected signals will be a shape vacant of a part of the detected signals as shown in FIG. 4(*b*). If one circuit wiring has a short circuit, the current waveform will has a significant disorder as shown in FIG. 4(*c*).

The following processing is performed to identify a location of the circuit wiring having the above defects.

An input signal is sent to the LSI in a specific pattern generated by the pattern generator, while a signal in synchronous with the pattern is also sent to the inspection apparatus. This makes it possible to promptly determine the relationship between each location in the waveform detected by the sensor and each of the circuit wirings.

For example, in FIG. 4, despite of existence of an output pulse signal from the 3rd terminal as shown in FIG. 4(*a*), no differential waveform is detected in the sensor output signal as shown in FIG. 4(*b*). Thus, it can be determined that the circuit wiring connected to the 3rd terminal includes a disconnection or open circuit, and thereby no voltage change is caused at the corresponding position of the sensor. Further, if a pair of circuit wirings connected respectively to the 6th and 7th terminals include a short circuit therebetween, the sensor output signal does not exhibit any distinct abnormality. For this reason, this inspection system is constructed to reliably detect the presence of a short circuit in the circuit wirings by checking the current waveform of the power supply.

Figure 5:
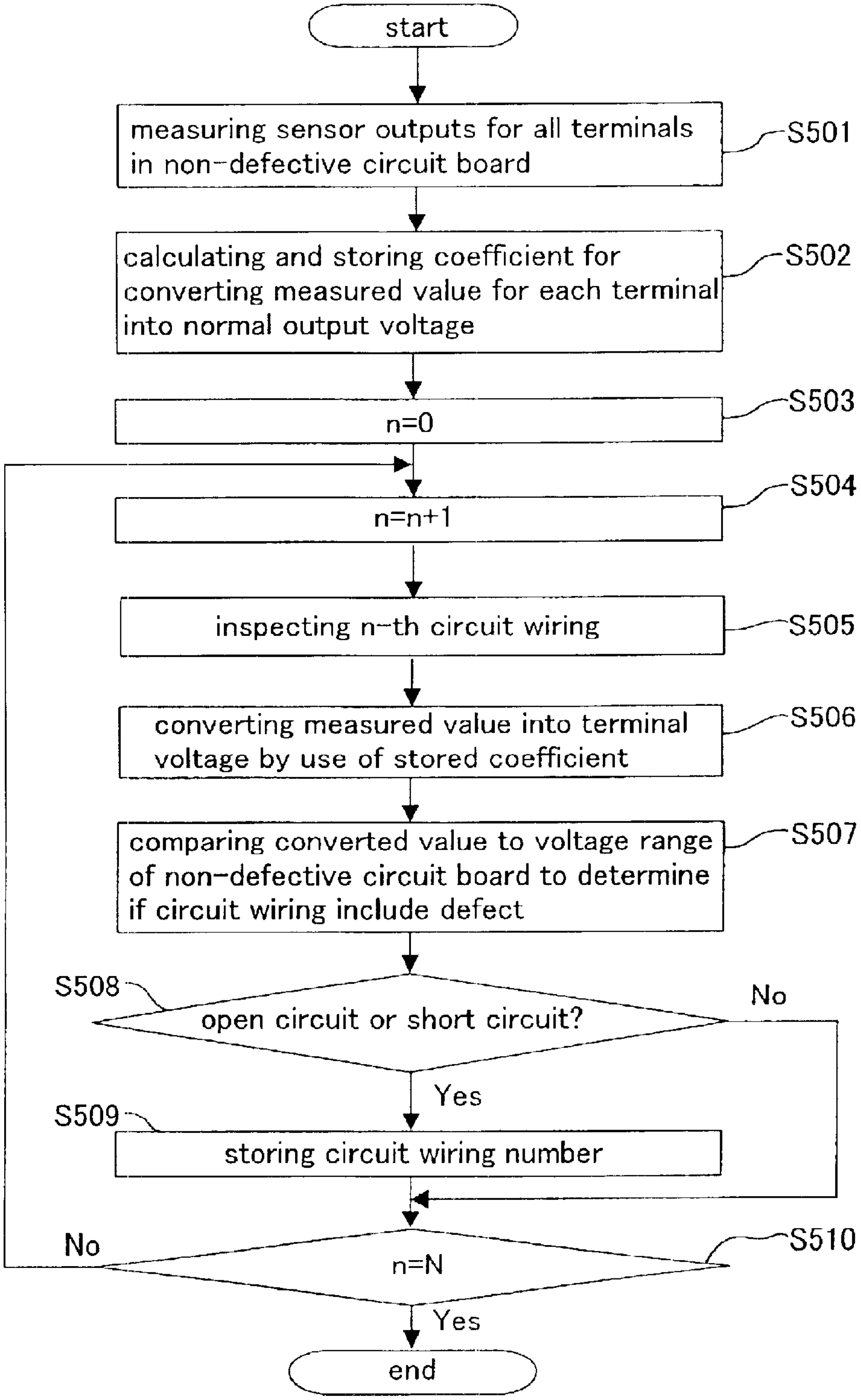
FIG. 5 is a flow chart of the inspection method according to the embodiment of the present invention.

With reference to the flowchart of FIG. 5, the processing flow in the inspection operation will be described below.

In Step S-501, sensor output signals corresponding to all terminals are measured in a non-defective circuit board. If a plurality of non-defective circuit boards are available, sensor output signals corresponding to the respective terminals may be measured and the measured values are averaged for each of the terminals.

In Step S-502, a coefficient for converting the measured value for each of the terminals into a normal output voltage is then calculated and stored. For example, assumed that the measured voltage for a certain terminal is 20 mV and the normal output voltage is 50 V, the coefficient will be 50/0.02=2500.

A circuit wiring number n is then initialized in Step S-503, and n is incremented in Step S-504. In Step S-505, a voltage waveform is measured in the n-th circuit wiring of a work (circuit board) to be inspected.

In Step S-506, the measured voltage value is converted into a terminal voltage by use of the coefficient stored for each of the terminals. In Step S-507, the converted value is compared to a criterion or a voltage range of the non-defective circuit board to determine if the circuit wiring has a defect or not. For example, when the sensor output voltage is 18 mV and the coefficient of the corresponding terminal is 2500, the output voltage is converted into 0.018×2500=45 V and this value is compared to the criterion. Specifically, if the voltage value is less than the minimum voltage of the non-defective circuit board, it will be determined that the circuit wiring includes an open circuit. At the same time, it is determined if the circuit wiring includes a short circuit, by checking the current in the power supply.

If one of open and short circuits is determined in the above Steps, the process proceeds to Step S-509, and the circuit wiring number and its determined defect are recorded, followed by proceeding to Step S-510. If no defect is determined, it is determined if n is equal to N. That is, it is determined if the inspection operation for the entire LSI circuit-wiring group is completed. If the inspection operation for the entire LSI circuit-wiring group has been completed, the processing is terminated. If not, the process returns to Step S-504, and the above inspection operation will be repeated.

When a plurality of circuit boards are inspected, measured voltage values for all of thire terminals are compared to the criterion in the same manner as that described above.

Further, abnormality in LSI characteristics is determined by analyzing characteristics of the output waveform from any one of the terminals (delay time and/or rise time). A short and/or open circuit or current consumption in the input terminals can also be measured.

When it is required to remove a defective circuit board even if only one defect is included in circuit wirings of the circuit board, in response to YES in Step S-508, the defect of the circuit board is notified to a user, and then the processing of this circuit board may be terminated without completing the inspection operation for the entire LSI circuit-wiring group. Otherwise, without the storing process in Step S-509, the defect of the circuit board may be simply notified to a user.

As above, in the inspection system according to this embodiment, open and/or short circuits in the circuit board having the onboard PDP driving LSI as an integrated circuit are detected in a non-contact manner. Thus, even if highly fine circuit patterns are introduced in the market, it is unnecessary to prepare mechanisms and spend much time for troublesome positioning operations. Further, the jig is not damaged and desired automatic mechanization can be facilitated because any probe is not used in the inspection system.

In addition, the inspection system according to this embodiment can inspect a circuit board having an onboard LSI. In the same state, the LSI itself can also be inspected (an inspection of current consumption during operation, an inspection and measurement of voltage, an inspection of functions such as IC characteristics or the like), and thereby the time for inspecting the entire PDP driver module can be remarkably reduced.

While the inspection system according to this embodiment integrates sensor outputs by means of providing a capacitance at the output section on the sensor, the capacitance may be substituted with an input capacitance of an amplifier circuit connected to the sensor or the like. In particular, when an input capacitance of a circuit connected to the subsequence stage of the sensor is greater than a desired capacitance, it is desirable to omit the capacitance for integration.

While this embodiment has been described by focusing on the PDP, it is to be understood that the present invention can be applied to fluorescent character display tubes or liquid crystal displays.

INDUSTRIAL APPLICABILITY

The present invention can provide an apparatus and method for inspecting a circuit board at a high speed.

What is claimed is:

1. An apparatus for inspecting a circuit board incorporating an integrated circuit, comprising:

drive means for forcibly driving said integrated circuit to generate output signals sequentially from a plurality of output terminals of said integrated circuit;

detect means for detecting in a non-contact manner a voltage value in a plurality of circuit wirings connected to said output terminals;

comparison means for comparing said voltage value to a normal value; and defect determination means for determining a defect in said circuit wirings according to the comparison result in said comparison means, wherein the detect means detects the voltage value by obtaining a capacitance value.

2. An apparatus as defined in claim 1, wherein said comparison means is operable to compare a waveform provided by plotting said voltage value on a time axis to a normal waveform.

3. An apparatus as defined in claim 1, wherein said detect means is adapted to generate a waveform representing the voltage change, and wherein when said waveform includes an abnormal waveform, said defect determination means is operable to identify defective one or ones of said circuit wirings according to the location of said abnormal waveform on a time axis.

4. An apparatus as defined in claim 1, wherein responsive to the comparison result in said comparison means indicating that said voltage value is equal to or less than a given value, said determination means is operable to determine that the circuit wiring corresponding to said voltage value includes an open circuit.

5. An apparatus as defined in claim 1, wherein said drive means includes a power supply for supplying a power to said integration circuit, and current detect means for detecting a current from said power supply, and wherein said defect determination means is operable to identify the circuit wirings having a short circuit according to the timing when a current waveform detected by said current detect means is significantly disordered.

6. An apparatus as defined in claim 1, wherein said defect determination means is operable to inspect a characteristic of said integrated circuit according to the comparison result in said comparison means.

7. An apparatus as defined in claim 1, wherein said detect means includes:

voltage change detect means for detecting in a non-contact manner a voltage change in a plurality of circuit wiring connected to said output terminals; and integration means for integrating the voltage change to derive a voltage value.

8. An apparatus as defined in claim 7, wherein said integration means is a capacitance for integration.

9. An apparatus as defined in claim 7, wherein said detect means further includes amplification means for amplifying the voltage change, and said integration means is a part of said amplification means.

10. An apparatus as defined in claim 7, wherein said voltage change detect means includes a single sensor board opposed to said plurality of circuit wirings in a non-contact manner to detect the voltage change in any one part of said plurality of circuit wiring.

11. An apparatus as defined in claim 10, wherein said sensor board includes a single conductive plate having a dimension arranged to cover said plurality of circuit wirings, said conductive plate including a single output terminal.

12. An apparatus as defined in claim 7, wherein said plurality of circuit wirings of voltage change detect means are driven to sequentially generate pulse signals as said output signals, and wherein said voltage change detect means is operable to sequentially differentiate the pulse signals and add the adjacent differential values to provide the sum as the voltage change.

13. An apparatus for inspecting a circuit board for use in a PDP driver, comprising:

detect means for detecting in a non-contact manner a voltage waveform in all of circuit wirings connected in a one-on-one arrangement to terminals of an LSI for use in a PDP driver;

determination means for determining whether or not the detected voltage waveform has a normal shape; and identification means responsive to the determination of an abnormality in the voltage waveform to identify defective one or ones of said circuit wirings according to the timing of occurrence of said abnormal waveform.

14. An apparatus as defined in claim 13, which further includes drive means for forcibly driving said LSI to generate output signals sequentially from said terminals of said LSI.

15. An apparatus as defined in claim 14, wherein said drive means includes a power supply for supplying a power to said LSI, and current detect means for detecting a current from said power supply, and wherein said defect determination means is operable to identify the circuit wirings having a short circuit according to the timing when a current waveform detected by said current detect means is significantly disordered.

16. An apparatus as defined in claim 13, wherein said determination means is operable responsive to the abnormality of a missing voltage waveform to determine that the circuit wiring corresponding to said missing voltage waveform includes an open circuit.

17. An apparatus as defined in claim 13, which further includes LSI inspection means for detecting abnormality in said LSI according to the determination result in said determination means.

18. A method for inspecting a circuit board incorporating an integrated circuit, comprising the steps of:

forcibly driving said integrated circuit to generate output signals sequentially from a plurality of output terminals of said integrated circuit;

detecting in a non-contact manner a voltage value in a plurality of circuit wirings connected to said output terminal;

comparing the detected voltage value to a given value; and determining a defect in said circuit wirings according to the comparison result in said comparing step;

wherein the detecting comprises detecting the voltage value by obtaining a capacitance value.

19. A method as defined in claim 18, wherein said detecting step includes the steps of:

detecting in a non-contact manner a voltage change in a plurality of circuit wirings connected said output terminals, and integrating the voltage change to derive a voltage value.

20. A method as defined in claim 19, wherein said integrating step includes the step of deriving the voltage value from the voltage change by means of a capacitance for integration.

21. A method as defined in claim 20, wherein said voltage change detecting step includes a step of detecting the voltage change in any one part of said plurality of circuit wiring by use of a single sensor board opposed to said plurality of circuit wirings in a non-contact manner.

22. A method as defined in claim 19, wherein said detecting step further includes the step of amplifying the voltage change, and said integrating step is a part of said amplifying step.

23. A method as defined in claim 19, wherein said comparing step includes the step of comparing a waveform provided by plotting said voltage value on a time axis to a normal waveform.

24. A method as defined in claim 19, wherein said detecting step includes the step of generating a waveform representing the voltage change, and wherein said defect determining step includes the step of when said waveform includes an abnormal waveform, identifying defective one or ones of said circuit wirings according to the location of said abnormal waveform on a time axis.

25. A method as defined in claim 19, wherein said driving step includes the step of driving said plurality of circuit wirings to sequentially generate pulse signals as said output signals, and wherein said voltage change detecting step includes the step of sequentially differentiating the pulse signals and adding the adjacent differential values to provide the sum as the voltage change.

26. A method as defined in claim 19, wherein said determining step includes the step of responsive to the comparison result in said comparison means indicating that said voltage value is equal to or less than said given value, determining that the circuit wiring corresponding to said voltage value includes an open circuit.

27. A method as defined in claim 19, wherein said driving step includes the step of detecting a current from a power supply for supplying a power to said integration circuit, and wherein said defect determining step includes the step of identifying the circuit wirings having a short circuit according to the timing when a current waveform detected by said current detect means is significantly disordered.

28. A method as defined in claim 19, wherein said defect determining step includes the step of inspecting a characteristic of said integrated circuit according to the comparison result in said comparing step.

29. A method for inspecting a circuit board for use in a PDP driver, comprising the steps of:

detecting in a non-contact manner a voltage waveform in all of circuit wirings connected in a one-on-one arrangement to terminals of an LSI for use in a PDP driver;

determining whether or not the detected voltage waveform has a normal shape; and responsive to the determination of an abnormality in the voltage waveform, identifying defective one or ones of said circuit wirings according to the timing of occurrence of said abnormal waveform.

30. A method as defined in claim 29, which further includes the step of forcibly driving said LSI to generate output signals sequentially from said terminals of said LSI.

31. A method as defined in claim 29, wherein said driving step includes the step of detecting a current from a power supply for supplying a power to said LSI, and wherein said defect determining step includes the step of identifying the circuit wirings having a short circuit according to the timing when a current waveform detected by said current detect means is significantly disordered.

32. A method as defined in claim 29, wherein said determining step includes the step of responsive to the abnormality of a missing voltage waveform to determine that the circuit wiring corresponding to said missing voltage waveform includes an open circuit.

33. A method as defined in claim 29, which further includes the step of detecting abnormality in said LSI according to the determination result in said determining step.

* * * * *